US011846890B2

(12) United States Patent
Patterson et al.

(10) Patent No.: US 11,846,890 B2
(45) Date of Patent: Dec. 19, 2023

(54) POSITIONING SUBSTRATES IN IMPRINT LITHOGRAPHY PROCESSES

(71) Applicant: Molecular Imprints, Inc., Austin, TX (US)

(72) Inventors: Roy Matthew Patterson, Hutto, TX (US); Charles Scott Carden, Austin, TX (US); Satish Sadam, Round Rock, TX (US)

(73) Assignee: Molecular Imprints, Inc., Austin, TX (US)

( * ) Notice: Subject to any disclaimer, the term of this patent is extended or adjusted under 35 U.S.C. 154(b) by 0 days.

(21) Appl. No.: 18/159,912

(22) Filed: Jan. 26, 2023

(65) Prior Publication Data

US 2023/0176493 A1    Jun. 8, 2023

Related U.S. Application Data

(60) Continuation of application No. 17/181,242, filed on Feb. 22, 2021, now Pat. No. 11,567,418, which is a
(Continued)

(51) Int. Cl.
*G03F 9/00* (2006.01)
*G03F 7/00* (2006.01)

(52) U.S. Cl.
CPC .......... *G03F 9/7042* (2013.01); *G03F 7/0002* (2013.01); *G03F 7/707* (2013.01); *G03F 7/70775* (2013.01)

(58) Field of Classification Search
CPC ..... G03F 9/7042; G03F 7/70816; G03F 7/703
See application file for complete search history.

(56) References Cited

U.S. PATENT DOCUMENTS 5,316,276 A * 5/1994 Heinle ................. G03F 9/70
269/21
6,337,484 B1 * 1/2002 Loopstra ............. G03F 7/70716
355/75
(Continued)

FOREIGN PATENT DOCUMENTS

CN    102203672    9/2011
CN    102736429    10/2012
(Continued)

OTHER PUBLICATIONS

CN Office Action in Chinese Application No. 201780064029.8, dated Dec. 14, 2020, 9 pages.
(Continued)

*Primary Examiner* — Kelly M Gambetta
*Assistant Examiner* — Virak Nguon
(74) *Attorney, Agent, or Firm* — Fish & Richardson P.C.

(57) ABSTRACT

An imprint lithography system includes: a first chuck configured to support a first substrate; a first bushing surrounding the first chuck and configured to pneumatically suspend the first chuck laterally within the first bushing; one or more supportive mechanisms disposed beneath the first chuck and configured to support the first chuck vertically within the first bushing, wherein the first chuck is configured to be forced in a downward direction against first vertical resistive forces provided by the one or more supportive mechanisms, while the first chuck is suspended laterally within the first bushing and while the first chuck is maintained in the first fixed rotational orientation.

20 Claims, 7 Drawing Sheets

Related U.S. Application Data division of application No. 15/699,831, filed on Sep. 8, 2017, now Pat. No. 10,928,744.

(60) Provisional application No. 62/410,651, filed on Oct. 20, 2016.

(56) References Cited

U.S. PATENT DOCUMENTS

| | | | |
|---|---|---|---|
| 6,408,767 | B1 | 6/2002 | Binnard et al. |
| 7,670,530 | B2 * | 3/2010 | Choi ............ B82Y 10/00 |
| | | | 264/293 |
| 9,852,937 | B2 * | 12/2017 | Huinck ........ H01L 21/68792 |
| 2007/0008513 | A1 | 1/2007 | Chung et al. |
| 2007/0170617 | A1 | 7/2007 | Choi et al. |
| 2010/0296070 | A1 | 11/2010 | Shibazaki |
| 2011/0013188 | A1 | 1/2011 | Slotboom et al. |
| 2011/0058150 | A1 | 3/2011 | Schaper |
| 2011/0085150 | A1 | 4/2011 | Ichinose |
| 2012/0274004 | A1 | 11/2012 | Kobrin |
| 2015/0219179 | A1 * | 8/2015 | Cui ............ F16F 15/03 |
| | | | 248/550 |
| 2016/0039126 | A1 * | 2/2016 | Tan ............ G03F 7/0002 |
| | | | 264/40.5 |
| 2016/0370712 | A1 | 12/2016 | Shibazaki |
| 2018/0113390 | A1 | 4/2018 | Patterson et al. |

FOREIGN PATENT DOCUMENTS

| | | |
|---|---|---|
| CN | 103062283 | 4/2013 |
| JP | H11-145041 A | 5/1999 |
| JP | 2006-100723 A | 4/2006 |
| JP | 2015-196222 A | 11/2015 |
| JP | 2016-157131 A | 9/2016 |
| KR | 20090111562 A | 10/2009 |
| WO | WO 2016041731 | 3/2016 |

OTHER PUBLICATIONS

JP Notice of Allowance in Japanese Appln. No. 2019-520885, dated Aug. 20, 2021, 5 pages (with English translation).

PCT International Search Report and Written Opinion for Application No. PCT/US2017/050678, dated Jan. 23, 2018, 14 pages.

Office Action in Korean Appln. No. 10-2023-7007214, dated Sep. 19, 2023, 15 pages (with English translation).

* cited by examiner

POSITIONING SUBSTRATES IN IMPRINT LITHOGRAPHY PROCESSES

CROSS-REFERENCE TO RELATED APPLICATIONS

This application is a continuation of U.S. application Ser. No. 17/181,242, filed on Feb. 22, 2021, which is a divisional of U.S. application Ser. No. 15/699,831, filed on Sep. 8, 2017, now U.S. Pat. No. 10,928,744, which claims the benefit of the filing date of U.S. Provisional Application No. 62/410,651, filed on Oct. 20, 2016, each of which is incorporated herein by reference in its entirety.

TECHNICAL FIELD

This invention relates to positioning substrates in imprint lithography processes, and more particularly to aligning top surfaces of multiple substrates with different thicknesses in a coplanar arrangement to achieve uniform imprinting atop the substrates.

BACKGROUND

Nanofabrication (e.g., nanoimprint lithography) can include the fabrication of very small structures that have features on the order of 100 nanometers or smaller. One application in which nanofabrication has had a significant impact is in the processing of integrated circuits. The semiconductor processing industry continues to strive for larger production yields, while increasing a number of circuits formed on a substrate per unit area of the substrate. To this end, nanofabrication has become increasingly important to achieving desired results in the semiconductor processing industry. Nanofabrication provides greater process control while allowing continued reduction of minimum feature dimensions of structures formed on substrates. Other areas of development in which nanofabrication has been employed include biotechnology, optical technology, mechanical systems, and the like. In some examples, nanofabrication includes simultaneously processing multiple substrates arranged respectively on multiple substrate supports having a same, fixed height by exposing the substrates to a processing module (e.g., an etching module, a photoresist curing module, or a feature formation module) to form various structures atop the substrates.

SUMMARY

The invention involves a realization that improvements in positioning substrates during imprint lithography processes can improve a quality (e.g., a uniformity) of imprinting atop different substrates that are processed simultaneously. Conventional imprint lithography processes may include simultaneously processing multiple substrates arranged respectively on multiple chucks having a same, fixed height by exposing the substrates to a processing module to form various structures atop the substrates. In cases where such multiple substrates have different thicknesses, a corresponding variability in heights of top surfaces of the substrates can result in undesirable, non-uniform imprinting among the substrates. In this regard, various design aspects of disclosed imprint lithography systems can allow consistent, tunable forces to be applied to multiple substrates of various thicknesses supported by a chuck assembly to achieve a coplanar arrangement of the top surfaces of the multiple substrates for desired imprint results atop the substrates. Such design aspects can include an equal weight of multiple chucks of the chuck assembly, substantially frictionless movement of the chucks within associated air bushings, minimal forces applied to the chucks by vacuum hoses supplying suction to the chucks, and equivalent anti-torsion configurations of the chucks. The chuck assembly can therefore prevent a variability in imprints that may otherwise occur if the top surfaces of all of the substrates were not positioned in the same vertical plane when acted upon by a flexible template.

One aspect of the invention features an imprint lithography method for positioning substrates. The imprint lithography method includes supporting first and second substrates respectively atop first and second chucks, pneumatically suspending the first and second chucks laterally within first and second bushings, supporting the first and second chucks vertically within the first and second bushings, maintaining the first and second chucks respectively in first and second fixed rotational orientations, and forcing the first and second chucks in a downward direction independently of each other respectively against first and second vertical resistive forces until first and second top surfaces of the first and second substrates are coplanar, while maintaining the first and second chucks suspended laterally within the first and second bushings and while maintaining the first and second chucks in the first and second fixed rotational orientations.

In some embodiments, a first thickness of the first substrate is different from a second thickness of the second substrate.

In certain embodiments, the method further includes respectively suctioning the first and second substrates to the first and second chucks.

In some embodiments, the first and second vertical resistive forces are provided by a vertical air pressure.

In certain embodiments, the method further includes controlling the vertical air pressure within an air plenum that is in fluid contact with the first and second chucks.

In some embodiments, the first and second vertical resistive forces are respectively provided by air delivered by first and second air cylinders.

In certain embodiments, the first and second vertical resistive forces are provided by a spring.

In some embodiments, the first and second fixed rotational orientations of the first and second chucks are maintained by first and second strips that connect the first and second chucks to a base supporting the first and second bushings.

In certain embodiments, the first and second fixed rotational orientations of the first and second chucks are maintained by first and second double-shaft arrangements respectively associated with the first and second bushings.

In some embodiments, the method further includes applying an upwardly directed force to a substrate processing element.

In some embodiments, the first and second chucks are pneumatically suspended within the first and second air bushings in a frictionless manner.

In certain embodiments, pneumatically suspending the first and second chucks within the first and second air bushings laterally includes applying radial air pressure to the first and second chucks.

In some embodiments, the imprint lithography method further includes directing air radially inward of the first and second bushings through first and second pores respectively arranged across first and second internal surfaces of the first and second bushings.

In certain embodiments, the imprint lithography method further includes abutting first and second end portions of the first and second chucks against a fixed structure to limit an upward vertical movement of the first and second chucks within the first and second bushings.

In some embodiments, the imprint lithography method further includes independently controlling suction pressures respectively applied to the first and second substrates.

Another aspect of the invention features an imprint lithography system that is operable to position substrates. The imprint lithography system includes first and second chucks configured to respectively support first and second substrates, first and second bushings respectively surrounding the first and second chucks and configured to pneumatically suspend the first and second chucks laterally within the first and second bushings, one or more supportive mechanisms disposed beneath the first and second chucks and configured to support the first and second chucks vertically within the first and second bushings, and first and second features that maintain the first and second chucks in first and second fixed rotational orientations. The first and second chucks are configured to be forced in a downward direction independently of each other respectively against first and second vertical resistive forces provided by the one or more supportive mechanisms until first and second top surfaces of the first and second substrates are coplanar, while the first and second chucks are suspended laterally within the first and second bushings and while the first and second chucks are maintained in the first and second fixed rotational orientations.

In some embodiments, a first thickness of the first substrate is different from a second thickness of the second substrate.

In certain embodiments, the imprint lithography system further includes a vacuum source configured to respectively suction the first and second substrates to the first and second chucks.

In some embodiments, the first and second vertical resistive forces are an air pressure.

In certain embodiments, the one or more supportive mechanisms include an air plenum that is configured to pneumatically suspend the first and second chucks vertically within the first and second bushings.

In some embodiments, the one or more supportive mechanisms include first and second air cylinders that are configured to pneumatically suspend the first and second chucks vertically within the first and second bushings.

In certain embodiments, the one or more supportive mechanisms include first and second springs that are configured to respectively support the first and second chucks vertically within the first and second bushings.

In some embodiments, the first and second features include first and second strips that connect the first and second chucks to a base supporting the first and second chucks.

In certain embodiments, the first and second features include first and second double-shaft arrangements respectively associated with the first and second bushings.

In some embodiments, the first and second chucks are configured to apply an upwardly directed force to a substrate processing element.

In some embodiments, the first and second bushings are configured to pneumatically suspend the first and second chucks laterally in a frictionless manner.

In certain embodiments, the first and second bushings are configured to pneumatically suspend the first and second chucks laterally within the first and second bushings by applying radial air pressure to the first and second chucks.

In some embodiments, the first and second bushings respectively define first and second pores arranged across first and second internal surfaces and through which air can be directed radially inward of the first and second bushings.

In certain embodiments, the first and second chucks include first and second stoppers that are configured to abut a supportive structure to limit an upward vertical movement of the first and second chucks within the first and second bushings.

In some embodiments, the imprint lithography system further includes first and second vacuum sources that are respectively associated with the first and second chucks.

The details of one or more embodiments of the invention are set forth in the accompanying drawings and the description below. Other features, aspects, and advantages of the invention will be apparent from the description, drawings, and claims.

BRIEF DESCRIPTION OF THE DRAWINGS

Like reference symbols in the various figures indicate like elements.

DETAILED DESCRIPTION

An imprint lithography system for positioning substrates is described below. The imprint lithography system includes multiple vertically movable chucks (e.g., vertically floatable chucks), multiple air bushings, and associated sources of pressure that allow the imprint lithography system to align multiple substrates of different thicknesses supported by the multiple chucks in a coplanar arrangement. Such an arrangement can improve the imprinting formed atop the substrates as compared to that which would be formed using systems with vertically fixed chucks.

Figure 1:
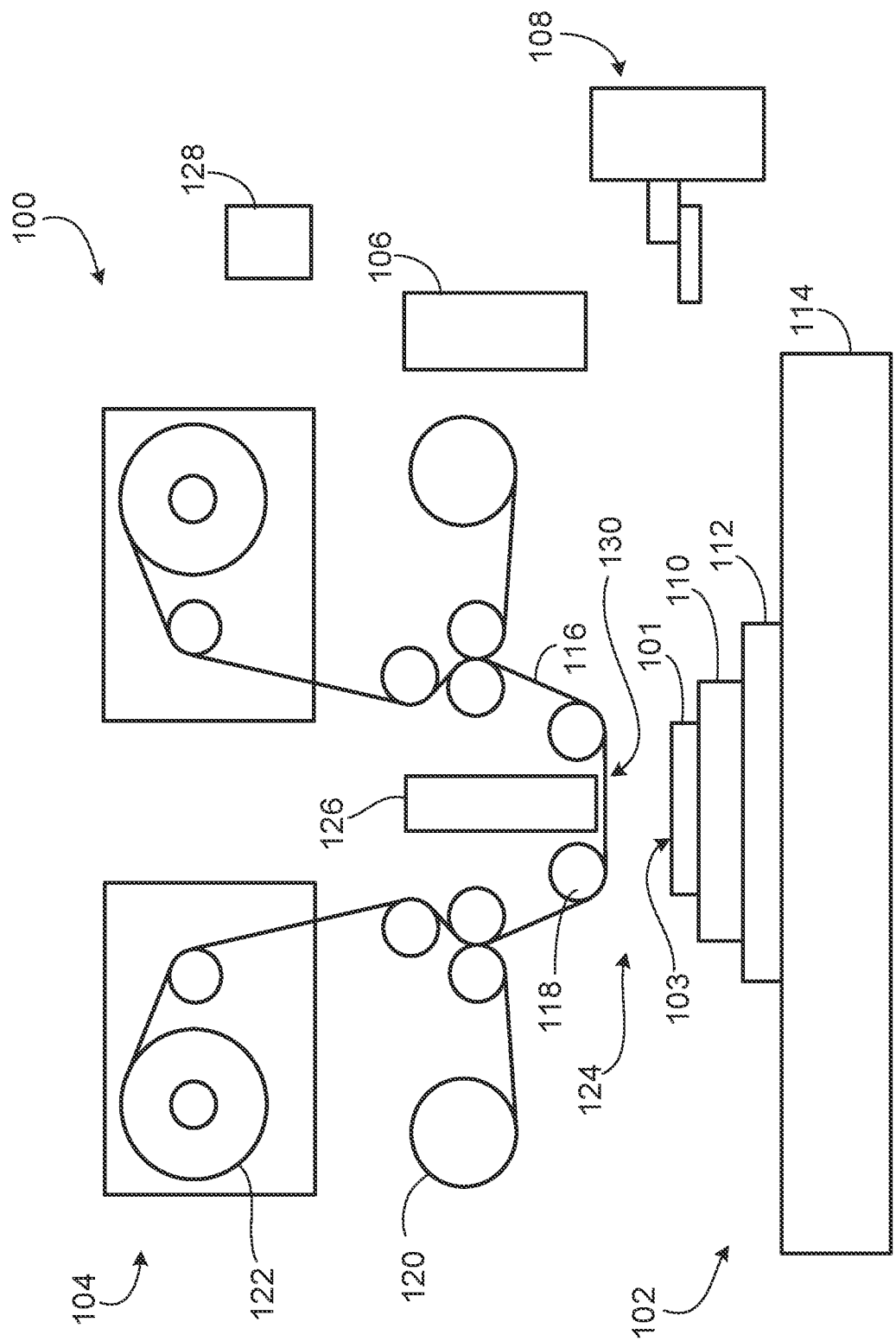
FIG. 1 is a diagram of an imprint lithography system.

FIG. 1 illustrates an imprint lithography system 100 that is operable to form a relief pattern on a top surface 103 of a substrate 101 (e.g., a wafer). The imprint lithography system 100 includes a support assembly 102 that supports and transports the substrate 101, an imprinting assembly 104 that forms the relief pattern on the top surface 103 of the substrate 101, a fluid dispenser 106 that deposits a polymerizable substance upon the top surface 103 of the substrate 101, and a robot 108 that places the substrate 101 on the support assembly 102. The imprint lithography system 100 also includes one or more processors 128 that can operate on a computer readable program stored in memory and that are in communication with and programmed to control the support assembly 102, the imprinting assembly 104, the fluid dispenser 106, and the robot 108.

The substrate 101 is a substantially planar, thin slice that is typically made of one or more materials including silicon, silicon dioxide, aluminum oxide, sapphire, germanium, gallium arsenide (GaAs), an alloy of silicon and germanium, indium phosphide (InP), or other example materials. The substrate 101 typically has a substantially circular or rectangular shape. The substrate 101 typically has a diameter in a range of about 50 mm to about 200 mm (e.g., about 65 mm, about 150 mm, or about 200 mm) or a length and a width in a range of about 50 mm to about 200 mm (e.g., about 65 mm, about 150 mm, or about 200 mm). The substrate 101 typically has and a thickness in a range of about 0.2 mm to about 1.0 mm. The thickness of the substrate 101 is substantially uniform (e.g., constant) across the substrate 101. The relief pattern is formed as a set of structural features (e.g., protrusions and suction structures) in the polymerizable substance upon the top surface 103 of the substrate 101, as will be discussed in more detail below.

The support assembly 102 includes a chuck 110 that supports and secures the substrate 101, an air bearing 112 that supports the chuck 110, and a base 114 that supports the air bearing 112. The base 114 is located in a fixed position, while the air bearing 112 can move in up to three directions (e.g., x, y, and z directions) to transport the chuck 110 (e.g., in some instances, carrying the substrate 101) to and from the robot 108, the fluid dispenser 106, and the imprinting assembly 104. In some embodiments, the chuck 110 is a vacuum chuck, a pin-type chuck, a groove-type chuck, an electromagnetic chuck, or another type of chuck.

Still referring to FIG. 1, the imprinting assembly 104 includes a flexible template 116 with a patterning surface defining an original pattern from which the relief pattern is formed complementarily on the top surface 103 of the substrate 101. Accordingly, the patterning surface of the flexible template 116 includes structural features such as protrusions and suction structures. The imprinting assembly 104 also includes multiple rollers 118, 120, 122 of various diameters that rotate to allow one or more portions of the flexible template 116 to be moved in the x direction within a processing region 130 of the imprint lithography system 100 to cause a selected portion of the flexible template 116 to be aligned (e.g., superimposed) with the substrate 101 along the processing region 130. One or more of the rollers 118, 120, 122 are individually or together moveable in the vertical direction (e.g., the z direction) to vary a vertical position of the flexible template 116 in the processing region 130 of the imprinting assembly 104. Accordingly, the flexible template 116 can push down on the substrate 101 in the processing region 130 to form an imprint atop the substrate 101. An arrangement and a number of the rollers 118, 120, 122 can vary, depending upon various design parameters of the imprint lithography system 100. In some embodiments, the flexible template 116 is coupled to (e.g., supported or secured by) a vacuum chuck, a pin-type chuck, a groove-type chuck, an electromagnetic chuck, or another type of chuck.

In operation of the imprint lithography system 100, the flexible template 116 and the substrate 101 are aligned in desired vertical and lateral positions by the rollers 118, 120, 122 and the air bearing 112, respectively. Such positioning defines a volume within the processing region 130 between the flexible template 116 and the substrate 101. The volume can be filled by the polymerizable substance once the polymerizable substance is deposited upon the top surface 103 of the substrate 101 by the fluid dispenser 106, and the chuck 110 (e.g., carrying the substrate 101) is subsequently moved to the processing region 130 by the air bearing 112.

Accordingly, both the flexible template 116 and the top surface 103 of the substrate 101 can be in contact with the polymerizable substance in the processing region 130 of the imprint lithography system 100. Example polymerizable substances may be formulated from one or more substances, such as isobornyl acrylate, n-hexyl acrylate, ethylene glycol diacrylate, 2-hydroxy-2-methyl-1-phenyl-propan-1-one, (2-Methyl-2-Ethyl-1,3-dioxolane-4-yl)methyl acrylate, hexanediol diacrylate, 2-methyl-1-[4-(methylthio)phenyl]-2-(4-morpholinyl)-1-propanone, diphenyl (2,4,6-trimethylbenzoyl)-phosphine oxide, 2-hydroxy-2-methyl-1-phenyl-1-propanone, and various surfactants. Example techniques by which the polymerizable substance may be deposited atop the substrate 101 by the fluid dispenser 106 include drop dispense, spin-coating, dip coating, chemical vapor deposition (CVD), physical vapor deposition (PVD), thin film deposition, thick film deposition, and other techniques. In some examples, the polymerizable substance is deposited atop the substrate 101 in multiple droplets.

The imprinting assembly 104 includes an energy source 126 that directs energy (e.g., broadband ultraviolet radiation) towards the polymerizable substance atop the substrate 101 within the processing region 130. Energy emitted from the energy source 126 causes the polymerizable substance to solidify and/or cross-link, thereby resulting in a patterned layer that conforms to a shape of the portion of the flexible template 116 in contact with the polymerizable substance in the processing region 130.

Figure 2:
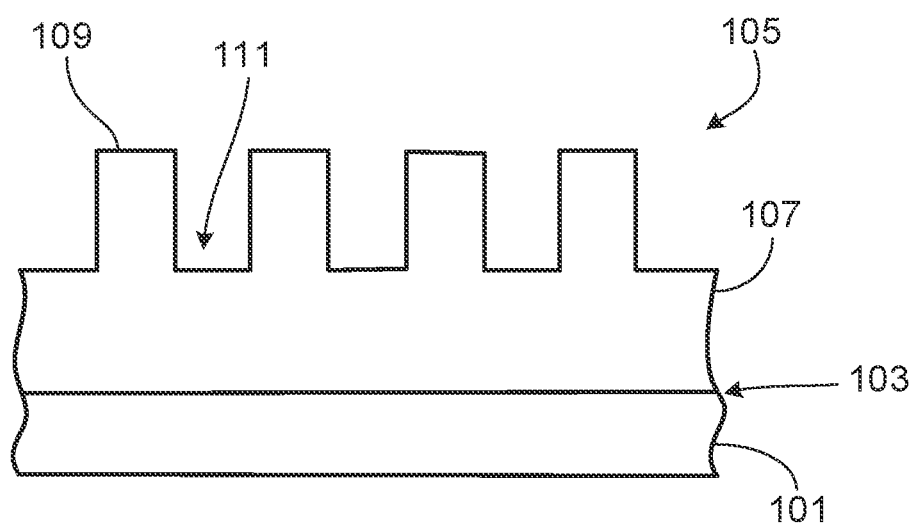
FIG. 2 is diagram of patterned layer formed by the imprint lithography system of FIG. 1.

FIG. 2 illustrates an example patterned layer 105 formed on the substrate 101 by the imprint lithography system 100. The patterned layer 105 includes a residual layer 107 and multiple features including protrusions 109 extending from the residual layer 107 and suction structures 111 formed by adjacent protrusions 109 and the residual layer 107.

Figure 3:
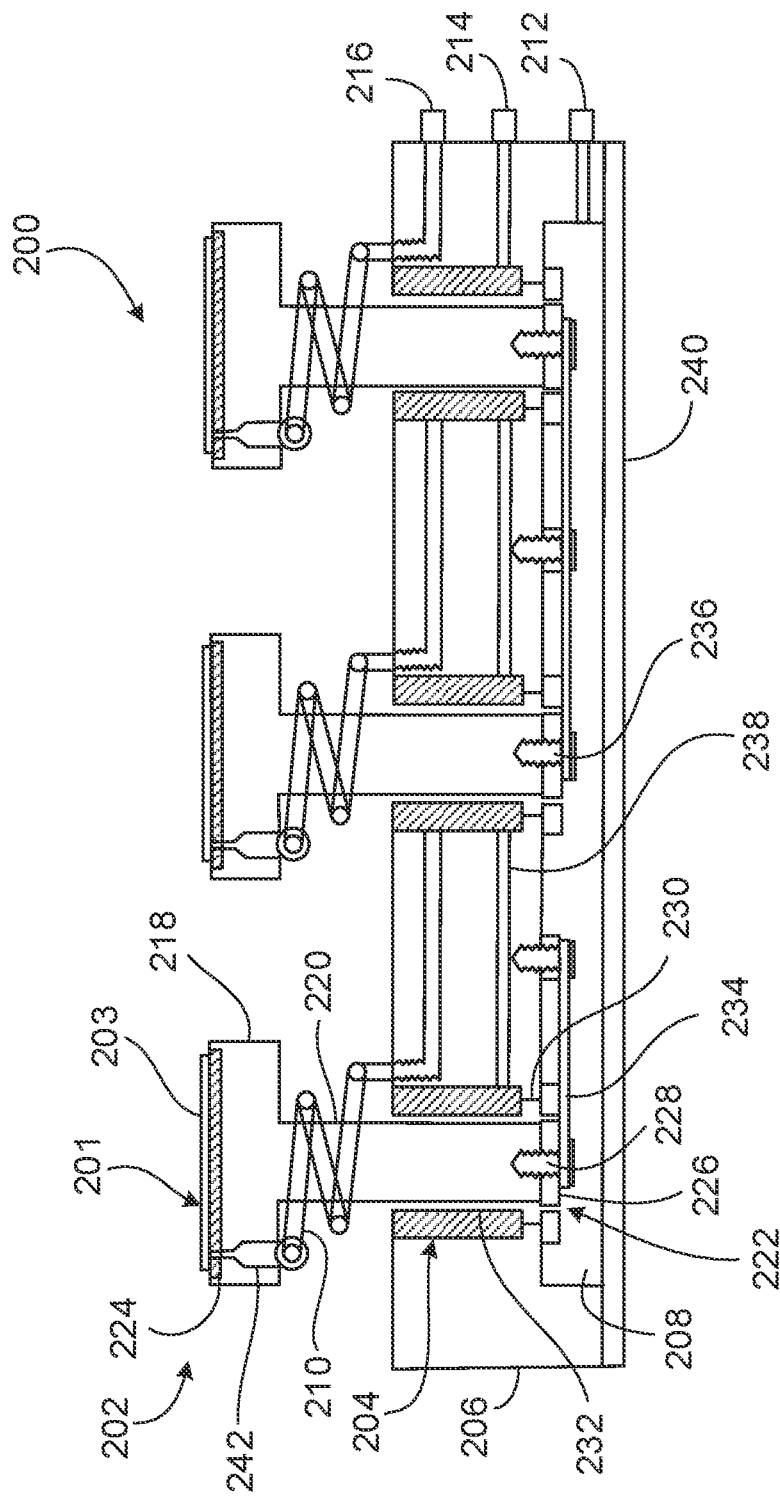
FIG. 3 is a sectional view of a chuck assembly including single-shaft pedestal chucks and an air plenum that can be used with the imprint lithography system of FIG. 1.

In some embodiments, the chuck 110 of the imprint lithography system 100 is a provided as a set of multiple chucks that are configured to support multiple substrates. For example, FIG. 3 illustrates a chuck assembly 200 (e.g., a cluster chuck) that includes an array of multiple, individual pedestal chucks 202 configured to support multiple substrates 201 simultaneously beneath the flexible template 116 in the processing region 130 of the imprint lithography system 100. In operation of the chuck assembly 200, the pedestal chucks 202 are permitted to move vertically and independently of one another such that top surfaces of respective substrates 201 with different thicknesses can be positioned in a same plane at a particular vertical position for uniform imprinting by the flexible template 116 across the multiple substrates 201. In addition to the pedestal chucks 202, the chuck assembly 200 includes multiple air bushings 204 respectively associated with the pedestal chucks 202, a base 206 that supports the air bushings 204, an air plenum 208 disposed beneath the base 206, and multiple vacuum hoses 210 respectively associated with the pedestal chucks 202.

The chuck assembly 200 also includes a pressure control port 212 by which the air pressure in the air plenum 208 can be controlled, an air supply port 214 that provides air to the air bushings 204, and a vacuum supply port 216 that provides negative pressure (e.g., suction) to the pedestal chucks 202. The pressure control port 212, the air supply support 214, and the vacuum supply port 216 are mounted to a side of the base 206.

Each pedestal chuck 202 includes a substrate mount 218, a shaft 220 extending from the substrate mount 218, and a stopper 222 attached to an end of the shaft 220. The substrate mount 218 has a substantially circular or rectangular shape and defines a suction structure 224 (e.g., a pin chuck) that extends across a top surface of the substrate mount 218 and that is sized to support a substrate 201. The substrate 201 is substantially similar in construction and material formulation to the substrate 101. The suction structure 224 typically has a width in a range of about 50 mm to about 200 mm, a length in a range of about 50 mm to about 200 mm, and a depth of about 0.2 mm to about 2.0 mm (e.g., about 1.0 mm). In some embodiments, the suction structure 224 defines an array of features (e.g., pins, rectangular protrusions, other protrusions, rectangular walls, or other features) arranged across and extending upward from a bottom surface of the suction structure in a regular pattern (e.g., in a waffle-like pattern).

The substrate mount 218 also defines a channel 242 that conveys a vacuum pressure from the vacuum hose 210 (e.g., supplied by the vacuum supply port 216) to the suction structure 224 for suctioning the substrate 201 against the substrate mount 218. The vacuum pressure is applied to the substrate 201 in the region around the array of features within the suction structure 224. The vacuum hose 210 is wrapped around the shaft 220 of the pedestal chuck 202 in a spiral configuration above the base 206. The negative pressure delivered by the vacuum hose 210 securely holds the substrate 201 against the substrate mount 218 of the pedestal chuck 202. The shaft 220 typically has a diameter of about 10 mm to about 50 mm (e.g., about 30 mm) and a length of about 50 mm to about 100 mm (e.g., about 75 mm).

The stopper 222 is provided as a bar 226 that is oriented perpendicular to the shaft 220 and a fastener 228 (e.g., a screw fastener) that extends through the bar 226 and into the shaft 220 of the pedestal chuck 202. A length of the bar 226 is greater than a diameter of the shaft 220, such that the bar 226 abuts a wall 230 of an opening in the base 206 when the air pressure in the air plenum 208 forces the pedestal chuck 202 in an upward direction. In this manner, the stopper 222 provides a bias that determines an initial vertical position of the pedestal chuck 202 and can limit an upward movement of the pedestal chuck 202.

Each air bushing 204 surrounds a shaft 220 of a pedestal chuck 202 and is formed as a cylindrical sleeve with multiple pores (e.g., a porous carbon sleeve) across an internal surface 232 of the air bushing 204. The internal surface of the 232 of the air bushing 204 has a diameter of about 10 mm to about 50 mm (e.g., about 30 mm) such that a radial clearance exists between the internal surface 232 and the shaft 220. Air supplied by the air supply port 214 and delivered by an air supply hose 238 passes through the pores of the air bushing 204 to apply an inward radial lifting force to the shaft 220 of the pedestal chuck 202, thereby causing the pedestal chuck 202 to float laterally (e.g., to be constrained radially) within the air bushing 204 without contacting the internal surface 232 of the air bushing 204. Accordingly, the shaft 220 of the pedestal chuck 202 is able to float in a centered position within (e.g., along a central axis of) the air bushing 204 in a substantially frictionless manner. Such a zero friction configuration is important for maintaining a constant imprint pressure between the flexible template 116 and all of the substrates 201 supported by the pedestal chucks 202.

The air plenum 208 is an air compartment sealed by a cover 240 (e.g., made of spring steel). An air pressure in the air plenum 208 can be controlled by the pressure control port 212. The air pressure in the air plenum 208 applies a vertical lifting force (e.g., that has a magnitude of a cross-sectional area of the shaft 220 multiplied by the air pressure) to each pedestal chuck 202 mounted above the air plenum 208. The vertical lifting force causes the pedestal chuck 202 to float vertically within the air bushing 204 along the central axis of the air bushing 204. Because the flexible template 116 is maintained at a constant vertical position above the chuck assembly 200, the flexible template 116 determines a vertical position of each pedestal chuck 202 as the flexible template 116 exerts a downward force (e.g., pushes downward) against the polymerizable substance atop the substrate 201. By way of the vertical lifting force, the pedestal chuck 202 also exerts an upward force (e.g., pushes upward) against the flexible template 116, which may improve a precision of features imprinted along the polymerizable substance atop the substrate 201.

Owing to the inward radial lifting force applied to the shafts 220 by the air bushings 204 and the upward lifting force applied to the shafts 220 by the air pressure in the air plenum 208, the multiple pedestal chucks 202 of the chuck assembly 200 are able to move vertically and independently of one another. As a result, top surfaces 203 of the substrates 201 supported by the multiple pedestal chucks 202 can be positioned (e.g., aligned) in a coplanar arrangement at a same vertical height, despite any variation in thicknesses of the substrates 201. Therefore, a constant imprint pressure can be achieved between the flexible template 116 and the substrates 201 supported by the multiple pedestal chucks 202.

Absent any force that restricts torsion, the shafts 220 of the pedestal chuck 202s are able to rotate within the air bushings 204. In this regard, the chuck assembly 200 includes multiple strips 234 (e.g., anti-torsion strips) that secure the pedestal chucks 202 to the base 206 of the chuck assembly 200 to prevent the pedestal chucks 202 from rotating within the air bushings 204. For example, the strips 234 can be attached at one end to a stopper 222 (e.g., to a fastener 228 of a stopper 222) of a pedestal chuck 202 and attached at a second end to a fastener 236 attached to the base 206. In some embodiments, the strips 234 are provided as thin, wide flexible (e.g., elastic) pieces of material that are able to move relatively easily in the vertical direction with little force applied, but that are stiff enough to resist rotational movement against a width of the strips 234.

According to an equal weight of the multiple pedestal chucks 202, substantially frictionless movement of the pedestal chucks 202 within the air bushings 204, minimal forces applied by the vacuum hoses 210 to the pedestal chucks 202, and equivalent anti-torsion configurations applied to the pedestal chucks 202, the chuck assembly 200 allows for consistent, tunable forces to be applied to multiple substrates 201 of various thicknesses supported by the chuck assembly 200 to achieve a coplanar arrangement of the top surfaces 203 of the multiple substrates 201 for desired (e.g., uniform) imprint results atop the substrates 201. Such design aspects of the chuck assembly 200 can prevent a variability (e.g., a non-uniformity) in imprints that may otherwise occur if the top surfaces 203 of all of the substrates 201 were not positioned in the same vertical plane when acted upon by the flexible template 116.

Figure 4:
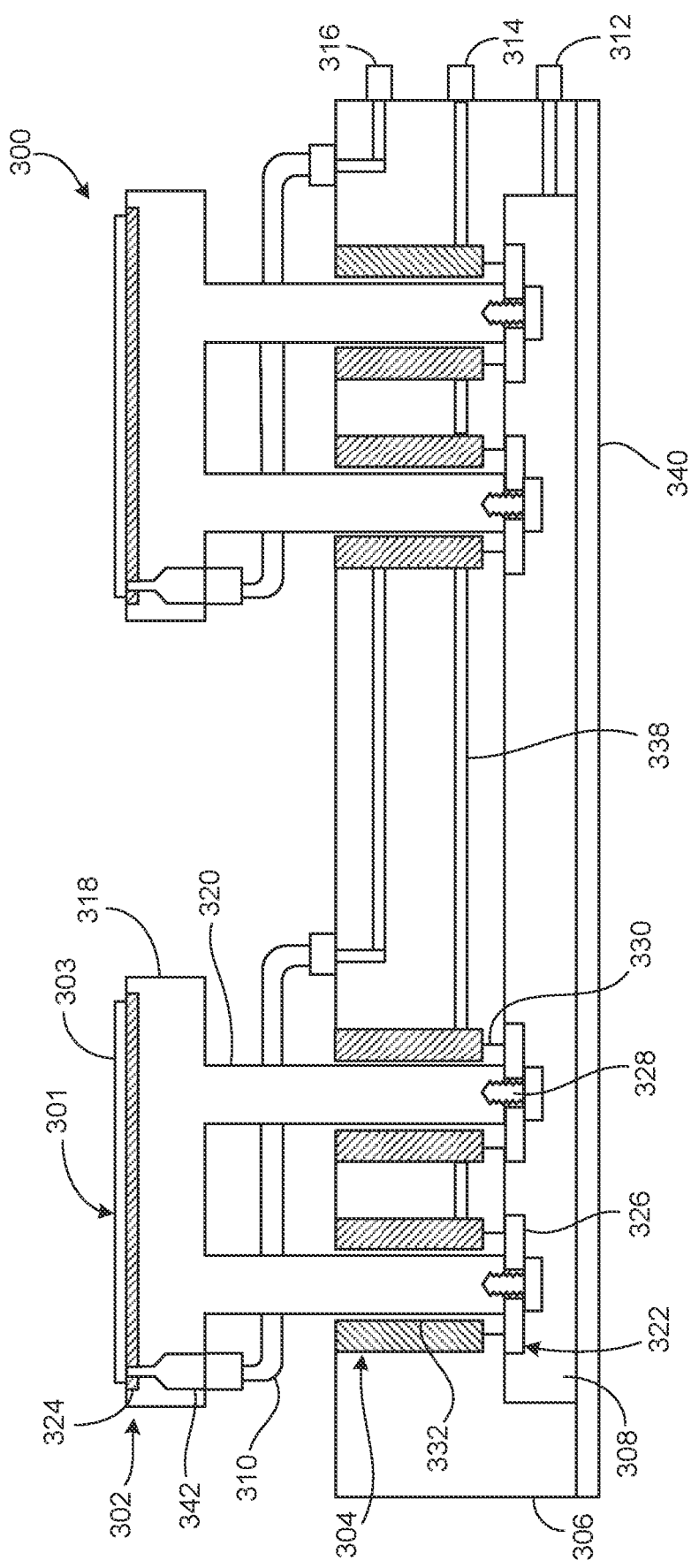
FIG. 4 is a sectional view of a chuck assembly including double-shaft pedestal chucks and an air plenum that can be used with the imprint lithography system of FIG. 1.

While the chuck assembly 200 has been described and illustrated as including the anti-torsion strips 234 to prevent rotation of the pedestal chucks 202 within the air bushings 204, in some embodiments, a chuck assembly that is similar in function to the chuck assembly 200 can alternatively have a different configuration for preventing rotation of chucks within air bushings. For example, as shown in FIG. 4, the chuck assembly 300 includes pedestal chucks 302 that have a double-shaft configuration for preventing rotation of the pedestal chucks 302. In operation of the chuck assembly 300, the pedestal chucks 302 are permitted to move vertically and independently of one another such that top surfaces of respective substrates 301 with different thicknesses can be positioned in a same plane at a particular vertical position for uniform imprinting by the flexible template 116 across the multiple substrates 301. In addition to the pedestal chucks 302, the chuck assembly 300 includes two air bushings 304 associated with each pedestal chuck 302, a base 306 that supports the air bushings 304, an air plenum 308 disposed beneath the base 306, and two vacuum hoses 310 respectively associated with the two pedestal chucks 302.

The chuck assembly 300 also includes a pressure control port 312 by which the air pressure in the air plenum 308 can be controlled, an air supply port 314 that provides air to the air bushings 304, and a vacuum supply port 316 that provides negative pressure (e.g., suction) to the pedestal chucks 302. The pressure control port 312, the air supply support 314, and the vacuum supply port 316 are mounted to a side of the base 306.

Each pedestal chuck 302 includes a substrate mount 318, two shafts 320 extending from each substrate mount 318, and a stopper 322 attached to an end of each shaft 320. The substrate mount 318 has a substantially circular or rectangular shape and defines a suction structure 324 (e.g., a pin chuck) that extends across a top surface of the substrate mount 318 and that is sized to support a substrate 301. The substrate 301 is substantially similar in construction and material formulation to the substrate 101. The suction structure 324 typically has a width in a range of about 50 mm to about 200 mm, a length in a range of about 50 mm to about 200 mm, and a depth of about 0.2 mm to about 2.0 mm (e.g., about 1.0 mm). In some embodiments, the suction structure 324 defines an array of features (e.g., pins, rectangular protrusions, other protrusions, rectangular walls, or other features) arranged across and extending upward from a bottom surface of the suction structure in a regular pattern (e.g., in a waffle-like pattern).

The substrate mount 318 also defines a channel 342 that conveys a vacuum pressure from the vacuum hose 310 (e.g., supplied by the vacuum supply port 316) to the suction structure 324 for suctioning the substrate 301 against the substrate mount 318. The vacuum pressure is applied to the substrate 301 in the region around the array of features within the suction structure 324. The vacuum hose 310 passes through the base 306 and up to the channel 342 of the substrate mount 318. The negative pressure delivered by the vacuum hose 310 securely holds the substrate 301 against the substrate mount 318 of the pedestal chuck 302. The shaft 320 typically has a diameter of about 10 mm to about 50 mm (e.g., about 30 mm) and a length of about 50 mm to about 100 mm (e.g., about 75 mm).

Each stopper 322 is provided as a bar 326 that is oriented perpendicular to the shaft 320 and a fastener 328 (e.g., a screw fastener) that extends through the bar 326 and into the shaft 320 of the pedestal chuck 302. A length of the bar 326 is greater than a diameter of the shaft 320, such that the bar 326 abuts a wall 330 of an opening in the base 306 when the air pressure in the air plenum 308 forces the pedestal chuck 302 in an upward direction. In this manner, the stoppers 322 provide a bias that determines an initial vertical position of the pedestal chuck 302 and can limit an upward movement of the pedestal chuck 302.

An air bushing 304 surrounds a shaft 320 of each pedestal chuck 302 and is formed as a cylindrical sleeve with multiple pores (e.g., a porous carbon sleeve) across an internal surface 332 of the air bushing 304. The internal surface of the 332 of the air bushing 304 has a diameter of about 10 mm to about 50 mm (e.g., about 30 mm) such that a radial clearance exists between the internal surface 332 and the shaft 320. Air supplied by the air supply port 314 and delivered by an air supply hose 338 passes through the pores of the air bushings 304 to apply an inward radial lifting force to the shafts 320 of the pedestal chuck 302, thereby causing the pedestal chuck 302 to float laterally (e.g., to be constrained radially) within the air bushing 304 without contacting the internal surface 332 of the air bushing 304. Accordingly, the shafts 320 of the pedestal chuck 302 are able to float respectively in centered positions within (e.g., along central axes of) the air bushings 304 in a substantially frictionless manner. Such a zero friction configuration is important for maintaining a constant imprint pressure between the flexible template 116 and all of the substrates 301 supported by the pedestal chucks 302. Owing to the central alignment of two shafts 320 within respective air bushings 304, the pedestal chucks 302 are substantially prevented from rotating within the air bushings 304.

The air plenum 308 is an air compartment sealed by a cover 340 (e.g., made of aluminum). An air pressure in the air plenum 308 can be controlled by the pressure control port 312. The air pressure in the air plenum 308 applies a vertical lifting force (e.g., that has a magnitude of a cross-sectional area of the shaft 320 multiplied by the air pressure) to each pedestal chuck 302 mounted above the air plenum 308. The vertical lifting force causes the shafts 320 of the pedestal chuck 302 to float vertically within the air bushings 304 along the central axes of the air bushings 304. Because the flexible template 116 is maintained at a constant vertical position above the chuck assembly 300, the flexible template 116 determines a vertical position of each pedestal chuck 302 as the flexible template 116 exerts a downward force (e.g., pushes downward) against the polymerizable substance atop the substrate 301. By way of the vertical lifting force, the pedestal chuck 302 also exerts an upward force (e.g., pushes upward) against the flexible template 116, which may improve a precision of features imprinted along the polymerizable substance atop the substrate 301.

Owing to the inward radial lifting force applied to the shafts 320 by the air bushings 304 and the upward lifting force applied to the shafts 320 by the air pressure in the air plenum 308, the multiple pedestal chucks 302 of the chuck assembly 300 are able to move vertically and independently of one another. As a result, top surfaces 303 of the substrates 301 supported by the multiple pedestal chucks 302 can be positioned (e.g., aligned) in a coplanar arrangement at a same vertical height, despite any variation in thicknesses of the substrates 301. Therefore, a constant imprint pressure can be achieved between the flexible template 116 and the substrates 301 supported by the multiple pedestal chucks 302.

According to an equal weight of the multiple pedestal chucks 302, substantially frictionless movement of the pedestal chucks 302 within the air bushings 304, minimal forces applied by the vacuum hoses 310 to the pedestal chucks 302, and equivalent anti-torsion configurations of the pedestal chucks 302, the chuck assembly 300 allows for consistent, tunable forces to be applied to multiple substrates 301 of various thicknesses supported by the chuck assembly 300 to achieve a coplanar arrangement of the top surfaces 303 of the multiple substrates 301 for desired (e.g., uniform) imprint results atop the substrates 301. Such design aspects of the chuck assembly 300 can prevent a variability (e.g., a non-uniformity) in imprints that may otherwise occur if the top surfaces 303 of all of the substrates 301 were not positioned in the same vertical plane when acted upon by the flexible template 116.

Figure 5:
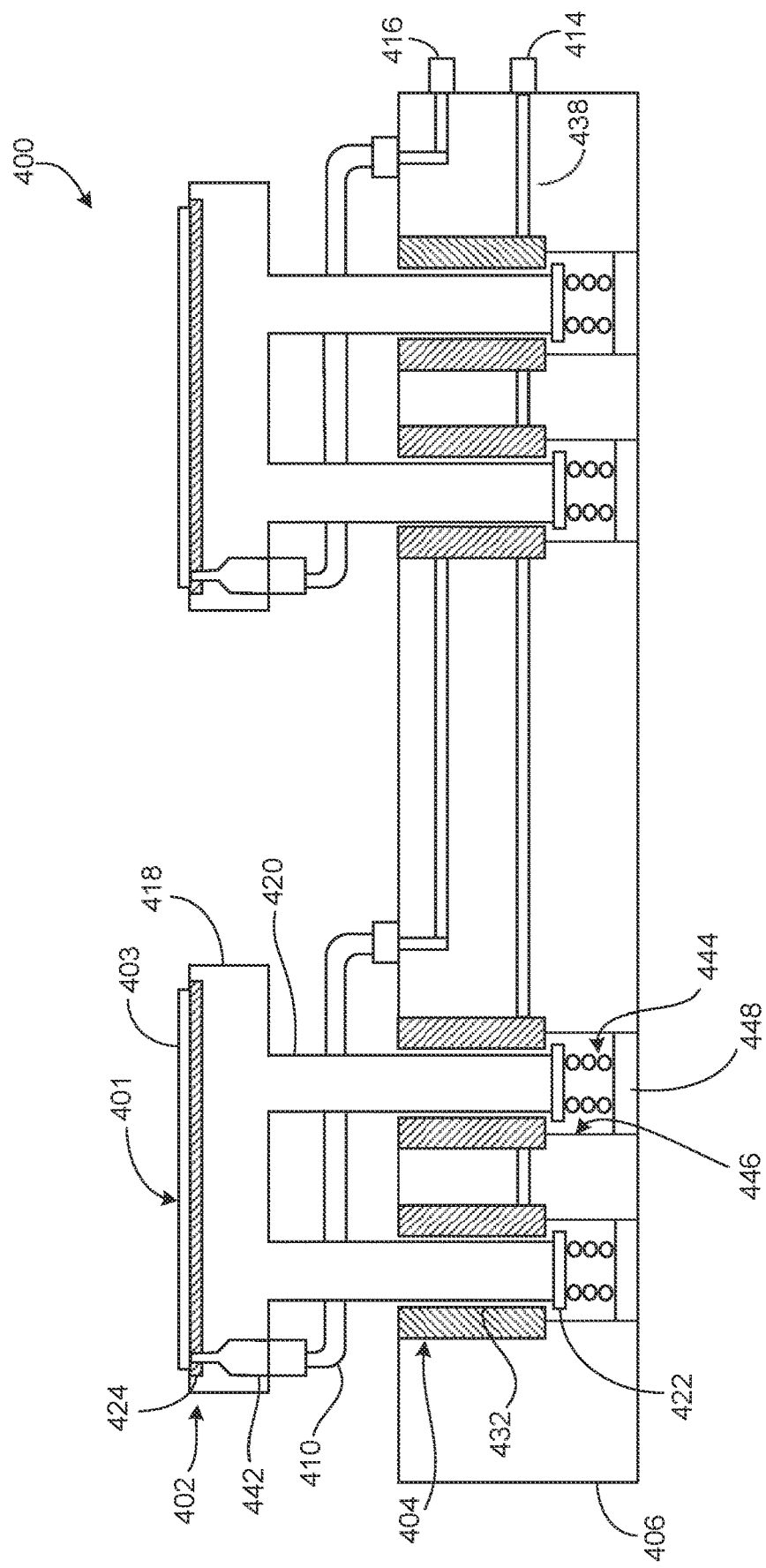
FIG. 5 is a sectional view of a chuck assembly including double-shaft pedestal chucks and compression springs that can be used with the imprint lithography system of FIG. 1.

While the chuck assemblies 200, 300 have been described and illustrated as including the air plenums 208, 308 that provide an upwardly directed force against the pedestal chucks 202, 302, in some embodiments, a chuck assembly that is similar in function to either of the chuck assemblies 200, 300 can alternatively include a different mechanism for providing an upwardly directed force against a pedestal chuck. For example, as shown in FIG. 5, the chuck assembly 400 includes compression springs 444 that provide vertical resistances to pedestal chucks 402. In operation of the chuck assembly 400, the pedestal chucks 402 are permitted to move vertically and independently of one another such that top surfaces of respective substrates 401 with different thicknesses can be positioned in a same plane at a particular vertical position for uniform imprinting by the flexible template 116 across the multiple substrates 401. A substrate 401 is substantially similar in construction and material formulation to the substrate 101.

The chuck assembly 400 is similar in construction and function to the chuck assembly 300, except that the chuck assembly 400 includes the compression springs 444 and associated spring mounts 448 instead of an air plenum and associated components. Accordingly, the chuck assembly 400 includes several components that are constructed and function as described above with respect to the various like components of the chuck assembly 300. For example, the chuck assembly 400 includes pedestal chucks 402 (e.g., including shafts 420, stoppers 422, and substrate mounts 418 defining suction structures 424 and channels 442), air bushings 404 (e.g., defining internal surfaces 432), a vacuum supply port 416, vacuum hoses 410, an air supply port 414, and air supply hoses 438.

The chuck assembly 400 also includes a base 406 that is similar to the base 306 and that supports the air bushings 404, the vacuum supply port 416, the vacuum hoses 410, the air supply port 414, and the air supply hoses 438. Additionally, instead of defining an air plenum, the base 406 defines four bores 446 that respectively support the air bushings 404 and spring mounts 448 that support the compression springs 444. Each stopper 422 is oriented perpendicular to the shaft 420, and a length of the stopper 422 is greater than a diameter of the shaft 420, such that the stopper 422 abuts the wall of the air bushing 404 within the bore 446 when the compression springs 444 force the pedestal chuck 402 in an upward direction. In this manner, the stoppers 422 provide a bias that determines an initial vertical position of the pedestal chuck 402 and can limit an upward movement of the pedestal chuck 402. Example materials from which the compression springs 444 may be formed include spring steel, music wire, and stainless steel.

The compression springs 444 apply a vertical lifting force to each pedestal chuck 402 disposed within the bores 446. The vertical lifting force causes the shafts 420 of the pedestal chucks 402 to float vertically within the air bushings 404 along central axes of the air bushings 404. Because the flexible template 116 is maintained at a constant vertical position above the chuck assembly 400, the flexible template 116 determines a vertical position of each pedestal chuck 402 as the flexible template 116 exerts a downward force (e.g., pushes downward) against the polymerizable substance atop the substrate 401. By way of the vertical lifting force, the pedestal chuck 402 also exerts an upward force (e.g., pushes upward) against the flexible template 116, which may improve a precision of features imprinted along the polymerizable substance atop the substrate 401.

Owing to the inward radial lifting force applied to the shafts 420 by the air bushings 404 and the upward lifting force applied to the shafts 420 by the compression springs 444, the multiple pedestal chucks 402 of the chuck assembly 400 are able to move vertically and independently of one another. As a result, top surfaces 403 of the substrates 401 supported by the multiple pedestal chucks 402 can be positioned (e.g., aligned) in a coplanar arrangement at a same vertical height, despite any variation in thicknesses of the substrates 401. Therefore, a constant imprint pressure can be achieved between the flexible template 116 and the substrates 401 supported by the multiple pedestal chucks 402.

According to an equal weight of the multiple pedestal chucks 402, substantially frictionless movement of the pedestal chucks 402 within the air bushings 404, minimal forces applied by the vacuum hoses 410 to the pedestal chucks 402, and equivalent anti-torsion configurations of the pedestal chucks 402, the chuck assembly 400 allows for consistent, tunable forces to be applied to multiple substrates 401 of various thicknesses supported by the chuck assembly 400 to achieve a coplanar arrangement of the top surfaces 403 of the multiple substrates 401 for desired (e.g., uniform) imprint results atop the substrates 401. Such design aspects of the chuck assembly 400 can prevent a variability (e.g., a non-uniformity) in imprints that may otherwise occur if the top surfaces 403 of all of the substrates 401 were not positioned in the same vertical plane when acted upon by the flexible template 116.

Figure 6:
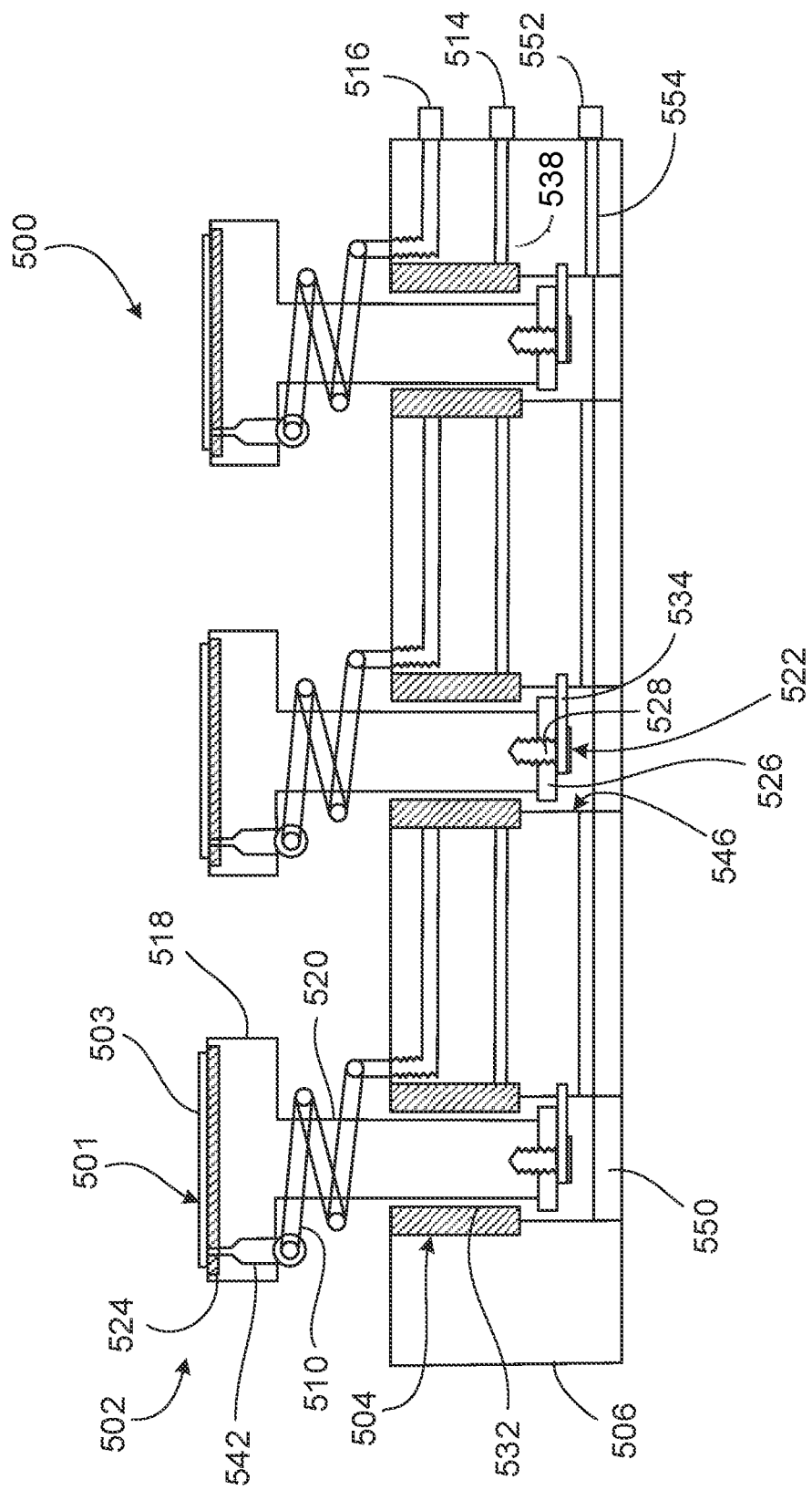
FIG. 6 is a sectional view of a chuck assembly including single-shaft pedestal chucks and air cylinders that can be used with the imprint lithography system of FIG. 1.

While the chuck assemblies 200, 300, 400 have been described and illustrated as including the air plenums 208, 308 or the compression springs 444 that provide an upwardly directed force against the pedestal chucks 202, 302, 402, in some embodiments, a chuck assembly that is similar in function to any of the chuck assemblies 200, 300, 400 can alternatively include a different mechanism for providing an upwardly directed force against a pedestal chuck. For example, as shown in FIG. 6, the chuck assembly 500 includes air cylinders 550 that provide vertical resistances to pedestal chucks 502. In operation of the chuck assembly 500, the pedestal chucks 502 are permitted to move vertically and independently of one another such that top surfaces of respective substrates 501 with different thicknesses can be positioned in a same plane at a particular vertical position for uniform imprinting by the flexible template 116 across the multiple substrates 501. A substrate 501 is substantially similar in construction and material formulation to the substrate 101.

The chuck assembly 500 is similar in construction and function to the chuck assembly 200, except that the chuck assembly 500 includes air cylinders 550, an associated air cylinder supply port 552, and associated air cylinder supply hoses 554 instead of an air plenum and associated components. Accordingly, the chuck assembly 500 includes several components that are constructed and function as described above with respect to the various like components of the chuck assembly 200. For example, the chuck assembly 500 includes pedestal chucks 502 (e.g., including shafts 520, stoppers 522 including the bars 526 and the fasteners 528, and substrate mounts 518 defining suction structures 524 and channels 542), air bushings 504 (e.g., defining internal surfaces 532), anti-torsion strips 534, a vacuum supply port 516, vacuum hoses 510, an air supply port 514, and air supply hoses 538.

The chuck assembly 500 also includes a base 506 that is similar to the base 206 and that supports the air bushings 504, the vacuum supply port 516, the vacuum hoses 510, the air supply port 414, the air supply hoses 438, the air cylinder supply port 552, and the air cylinder supply hoses 554. Additionally, instead of defining an air plenum, the base 506 defines three bores 546 that respectively support the air bushings 504 and the air cylinders 550. The bar 526 of each stopper 522 is oriented perpendicular to the shaft 520, and a length of the bar 526 is greater than a diameter of the shaft 520, such that the stopper 522 abuts the wall of the air bushing 504 within the bore 546 when air delivered by an air cylinder 550 forces the pedestal chuck 502 in an upward direction. In this manner, the stopper 522 provides a bias that determines an initial vertical position of the pedestal chuck 502 and can limit an upward movement of the pedestal chuck 502.

Air delivered by the air cylinders 550 applies vertical lifting forces to the pedestal chucks 502 disposed within the bores 546. The vertical lifting force causes the pedestal chucks 502 to float vertically within the air bushings 504 along central axes of the air bushings 504. Because the flexible template 116 is maintained at a constant vertical position above the chuck assembly 500, the flexible template 116 determines a vertical position of each pedestal chuck 502 as the flexible template 116 exerts a downward force (e.g., pushes downward) against the polymerizable substance atop the substrate 501. By way of the vertical lifting force, the pedestal chuck 502 also exerts an upward force (e.g., pushes upward) against the flexible template 116, which may improve a precision of features imprinted along the polymerizable substance atop the substrate 501.

Owing to the inward radial lifting force applied to the shafts 520 by the air bushings 504 and the upward lifting force applied to the shafts 420 by the air delivered by the air cylinders 550, the multiple pedestal chucks 502 of the chuck assembly 500 are able to move vertically and independently of one another. As a result, top surfaces 503 of the substrates 501 supported by the multiple pedestal chucks 502 can be positioned (e.g., aligned) in a coplanar arrangement at a same vertical height, despite any variation in thicknesses of the substrates 501. Therefore, a constant imprint pressure can be achieved between the flexible template 116 and the substrates 501 supported by the multiple pedestal chucks 502.

According to an equal weight of the multiple pedestal chucks 502, substantially frictionless movement of the pedestal chucks 502 within the air bushings 504, minimal forces applied by the vacuum hoses 510 to the pedestal chucks 502, and equivalent anti-torsion configurations of the pedestal chucks 502, the chuck assembly 500 allows for consistent, tunable forces to be applied to multiple substrates 501 of various thicknesses supported by the chuck assembly 500 to achieve a coplanar arrangement of the top surfaces 503 of the multiple substrates 501 for desired (e.g., uniform) imprint results atop the substrates 501. Such design aspects of the chuck assembly 500 can prevent a variability (e.g., a non-uniformity) in imprints that may otherwise occur if the top surfaces 503 of all of the substrates 501 were not positioned in the same vertical plane when acted upon by the flexible template 116.

Figure 7:
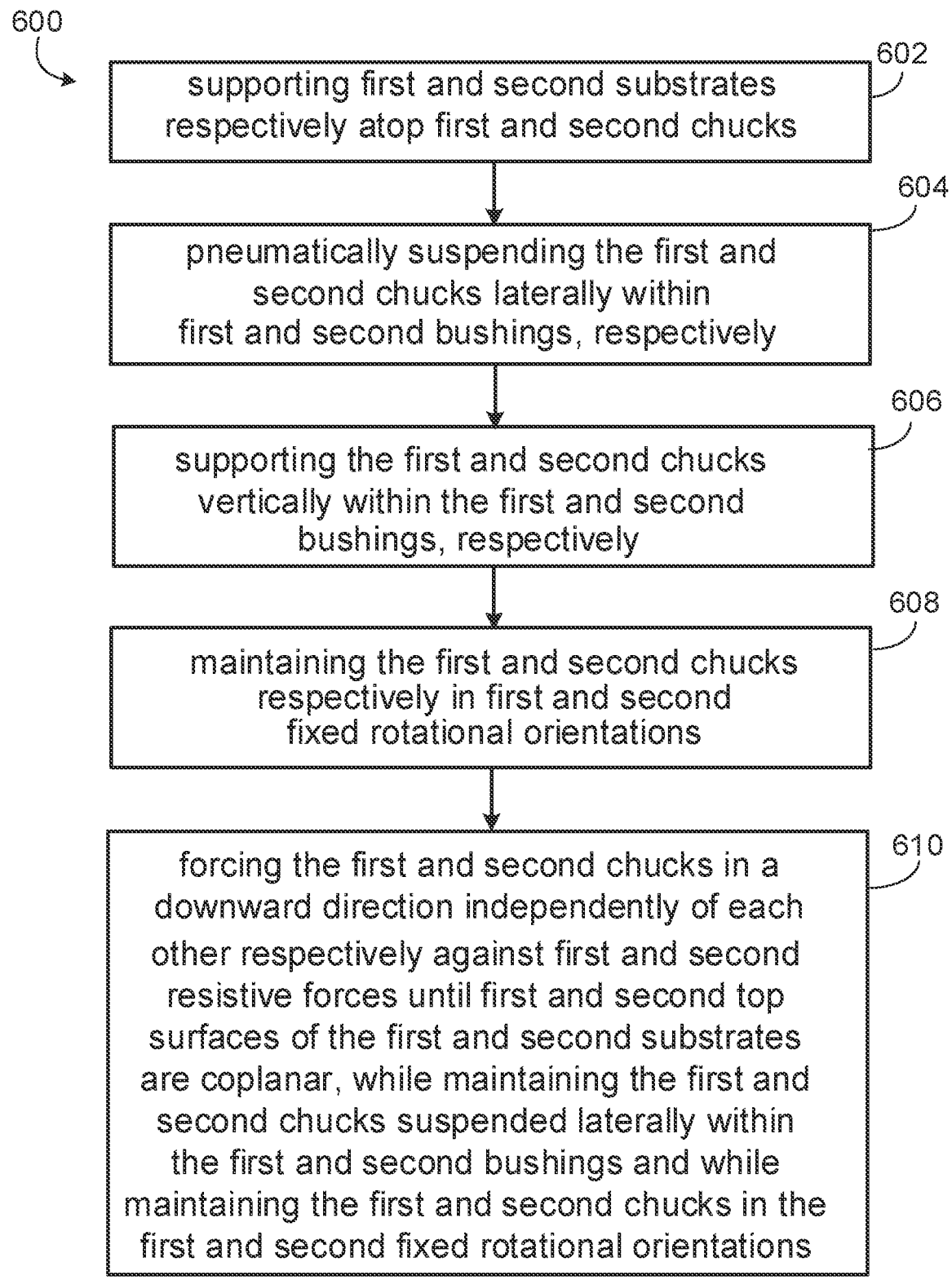
FIG. 7 is a flow chart of an example process for positioning substrates in an imprint lithography process.

FIG. 7 displays a flow chart of an example process 600 for positioning substrates in an imprint lithography process. First and second substrates (e.g., the substrates 201, 301, 401, 501) are respectively supported atop first and second chucks (e.g., the pedestal chucks 202, 302, 402, 502) (602). A first thickness of the first substrate may be different from a second thickness of the second substrate. The first and second substrates may be supported by suctioning the first and second substrates to the first and second chucks. In some examples, suction pressures applied to the first and second substrates may be controlled independently of each another.

The first and second chucks are pneumatically suspended laterally within first and second bushings (e.g., the air bushings 204, 304, 404, 504) (604). The first and second chucks are pneumatically suspended within the first and second air bushings in a frictionless manner. Pneumatically suspending the first and second chucks within the first and second air bushings includes applying radial air pressure to the first and second chucks. For example, air is directed radially inward of the first and second bushings through first and second pores respectively arranged across first and second internal surfaces (e.g., the internal surface 232, 332, 432, 532) of the first and second bushings. The first and second chucks are supported vertically within the first and second bushings (606). Furthermore, an upwardly directed force is applied to a substrate processing element.

The first and second chucks are maintained respectively in first and second fixed rotational orientations (608). In some examples, the first and second fixed rotational orientations of the first and second chucks are maintained by first and second strips (e.g., the strips 234, 534) that connect the first and second chucks to a base (e.g., the base 206, 506) supporting the first and second bushings. In some examples, the first and second fixed rotational orientations of the first and second chucks are maintained by first and second double-shaft arrangements (e.g., provided by the shafts 320, 420) respectively associated with the first and second bushings.

While the first and second chucks are maintained suspended within the first and second bushings and maintained in the first and second fixed rotational orientations, the first and second chucks are forced in a downward direction independently of each other against first and second vertical resistive forces until first and second top surfaces of the first and second substrates are coplanar (610). In some examples, the first and second vertical resistive forces are provided by a vertical air pressure. For example, the vertical air pressure may be controlled within an air plenum (e.g., the plenum 208, 308) that is in fluid contact (e.g., air contact) with the first and second chucks. In other cases, the first and second vertical resistive forces are respectively provided by air delivered by first and second air cylinders (e.g., the air cylinders 550). In some examples, the first and second vertical resistive forces are provided by a spring (e.g., the compression spring 444).

While the chuck assemblies 200, 300, 400, 500 have been respectively illustrated as including three pedestal chucks 202, 502 arranged in a 1×3 array and two pedestal chucks 302, 402 arranged in a 1×2 array, in some embodiments, a chuck assembly that is similar in construction and function to any of the chuck assemblies 200, 300, 400, 500 can alternatively include a different number of pedestal chucks arranged in a different configuration. Other example configurations include 4 pedestal chucks arranged in a 2×2 array, 6 pedestal chucks arranged in a 2×3 array, and 9 pedestal chucks arranged in a 3×3 array. Variation of the pedestal chuck configuration can allow for processing of smaller substrates while maintaining tool throughput with respect to substrate area.

While the chuck assemblies 200, 300, 400, 500 have been described and illustrated as including one vacuum supply port 216, 316, 416, 516 that supplies a vacuum pressure to all of the pedestal chucks 202, 302, 402, 502, in some embodiments, a chuck assembly that is similar in construction and function to any of the chuck assemblies 200, 300, 400, 500 can alternatively include multiple vacuum supply ports that each respectively supply a different pedestal chuck. Such a configuration may be advantageous in cases where substrates are to be unloaded from the pedestal chucks separately from one another (e.g., individually at different times).

While the chuck assemblies 200, 300, 400, 500 have been described and illustrated as including the vacuum-pin type chucks 202, 302, 304, 404 that suction the substrates 201, 301, 401, 501 into the suction structures 224, 324, 424, 524 of the chucks 202, 302, 402, 502, in some embodiments, a chuck assembly that is similar in construction and function to any of the chuck assemblies 200, 300, 400, 500 can alternatively include a different type of chuck that uses both positive and negative pressure to float a substrate above the chuck without contact between the substrate and the chuck.

While the chuck assemblies 200, 300 have been described and illustrated as including the plenums 208, 308 and the pressure control ports 212, 312 that supply the same air pressure to all of the pedestal chucks 202, 302, in some embodiments, a chuck assembly that is similar in construction and function to the chuck assembly 200 or to the chuck assembly 300 can alternatively include a segmented plenum and multiple pressure control ports that respectively supply a different, controllable air pressure to each pedestal chuck 202, 302. Such a configuration may be advantageous in cases where it is necessary for the pedestal chuck 202, 302 to push upward against the flexible template 116 where supported by the rollers 118 with a higher force than what is needed to be applied to an unsupported portion of the flexible template 116 beneath the energy source 126 while the imprint cures atop the substrate 201, 301. In such cases, the air pressure to a pedestal chuck 202, 302 may be reduced as the substrate 201, 301 is moved from the supported portion of the flexible template 116, while the air pressure to pedestal chucks 202, 302 not yet in contact with the supported portion of the flexible template 116 is maintained at a higher level until such pedestal chucks 202, 302 are transitioned to the unsupported portion of the flexible template 116.

While the chuck assembly 400 has been described and illustrated as including the compression springs 444 for providing a vertical lifting force and as including an anti-torsion configuration provided by a double-shaft arrangement of the pedestal chucks 402, in some embodiments, a chuck assembly that is similar in construction and function to the chuck assembly 400 can alternatively include compression springs for providing a vertical lifting force to single-shaft pedestal chucks (e.g., such as the pedestal chucks 202) and an anti-torsion configuration provided by anti-torsion strips (e.g., such as the anti-torsion strips 234).

While the chuck assembly 500 has been described and illustrated as including the air cylinders 550 for providing a vertical lifting force and as including an anti-torsion configuration provided by anti-torsion strips 534, in some embodiments, a chuck assembly that is similar in construction and function to the chuck assembly 500 can alternatively include air cylinders for providing a vertical lifting force to double-shaft pedestal chucks (e.g., such as the pedestal chucks 302) that exhibit an anti-torsion configuration.

While a number of embodiments have been described for illustration purposes, the foregoing description is not intended to limit the scope of the invention, which is defined by the scope of the appended claims. There are and will be other examples, modifications, and combinations within the scope of the following claims.

What is claimed is:

1. An imprint lithography system, comprising:
 a first chuck configured to support a first substrate;
 a first bushing surrounding the first chuck and configured to pneumatically suspend the first chuck laterally within the first bushing;
 one or more supportive mechanisms disposed beneath the first chuck and configured to support the first chuck vertically within the first bushing,
 wherein the first chuck is configured to be forced in a downward direction against first vertical resistive forces provided by the one or more supportive mechanisms, while the first chuck is suspended laterally within the first bushing and while the first chuck is maintained in a first fixed rotational orientation.

2. The imprint lithography system of claim 1, comprising an anti-torsion strip configured to prevent rotation of the first chuck within the first bushing.

3. The imprint lithography system of claim 1, wherein the first chuck comprises a first shaft, wherein the first bushing surrounds the first shaft, and
 wherein the first chuck comprises a second shaft and a second bushing configured to pneumatically suspend the first chuck laterally within the second bushing, wherein the second bushing surrounds the second shaft.

4. The imprint lithography system of claim 1, wherein the one or more supportive mechanisms comprise an air plenum that is configured to pneumatically suspend the first chuck vertically within the first bushing.

5. The imprint lithography system of claim 1, wherein the one or more supportive mechanisms comprise a first air cylinder configured to pneumatically suspend the first chuck vertically within the first bushing.

6. The imprint lithography system of claim 1, wherein the one or more supportive mechanisms comprise a first spring that is configured to support the first chuck vertically within the first bushing.

7. The imprint lithography system of claim 1, wherein the first chuck comprises:
 a substrate mount;
 a shaft extending from the substate mount; and
 a stopper attached to an end of the shaft, wherein the stopper is arranged within the imprint lithography system to define an initial vertical position of the first chuck.

8. The imprint lithography system of claim 7, wherein the stopper comprises a bar and a fastener, wherein the bar is oriented perpendicular to the shaft, and wherein the fastener secures the bar to the shaft.

9. The imprint lithography system of claim 7, wherein the substrate mount defines a channel through which a vacuum pressure is applied.

10. The imprint lithography system of claim 9, wherein the substrate mount further defines a suction structure that extends across a surface of the substrate mount, wherein the suction structure is coupled to the channel defined in the substrate mount such that, when the vacuum pressure is conveyed through the channel to the suction structure.

11. The imprint lithography system of claim 1, wherein the first bushing is a cylindrical sleeve, wherein the first bushing comprises a plurality of pores across a surface of the bushing.

12. The imprint lithography system of claim 11, wherein the first chuck comprises a shaft, and wherein there is a radial clearance between a surface of the first bushing and the shaft.

13. The imprint lithography system of claim 1, wherein the first vertical resistive forces comprises air pressure.

14. The imprint lithography system of claim 1, wherein the first chuck is configured to apply an upwardly directed force to a substrate processing element.

15. The imprint lithography system of claim 1, comprising an imprinting assembly arranged above the first chuck.

16. The imprint lithography system of claim 15, wherein the imprinting assembly comprises a plurality of rollers configured to cause movement of a flexible template so as to align over the first chuck.

17. An imprint lithography system, comprising:
a chuck configured to support a substrate;
a bushing surrounding the chuck and configured to pneumatically suspend the chuck laterally within the bushing, wherein the chuck is moveable along a vertical direction within the bushing; and
one or more supportive mechanisms disposed beneath the chuck and configured to support the chuck at different positions along the vertical direction within the bushing,
wherein the chuck comprises a shaft and a stopper fastened to the shaft, wherein the stopper is arranged to limit movement of the chuck along the vertical direction within the bushing.

18. The imprint lithography system of claim 17, wherein the shaft is surrounded by the bushing.

19. The imprint lithography system of claim 18, wherein the bushing is a cylindrical sleeve, wherein the bushing comprises a plurality of pores across a surface of the bushing.

20. The imprint lithography system of claim 17, wherein the stopper comprises a bar arranged such that the bar abuts a wall of the bushing to limit movement of the chuck along the vertical direction.

* * * * *